United States Patent
Mattas

(10) Patent No.: US 6,215,663 B1
(45) Date of Patent: Apr. 10, 2001

(54) PRINTED CIRCUIT BOARD ASSEMBLY WITH IMPROVED THERMAL PERFORMANCE

(75) Inventor: Charles B. Mattas, Glenview, IL (US)

(73) Assignee: Philips Electronics North America Corporation, New York, NY (US)

(*) Notice: Subject to any disclaimer, the term of this patent is extended or adjusted under 35 U.S.C. 154(b) by 0 days.

(21) Appl. No.: 09/526,943

(22) Filed: Mar. 16, 2000

(51) Int. Cl.[7] .................................................. H05K 7/20
(52) U.S. Cl. .......................... 361/704; 361/704; 361/710; 361/674; 315/46; 362/221
(58) Field of Search .................................. 361/702–707, 361/710–722, 749, 761, 764, 740, 753, 674; 315/46, 49, 50, 70, 71, 94, 32, 51–53, 54–58; 165/185, 80.3, 80.2, 80.4; 174/16.3, 17 VA, 52.1, 52.4; 257/712, 718; 313/46; 362/294, 373, 221, 260; 445/23; 29/592.1, 832, 525.2, 602.1; 336/61; 438/122, 106, 121

(56) References Cited

U.S. PATENT DOCUMENTS

| | | | |
|---|---|---|---|
| 5,375,039 | * 12/1994 | Wiessa | 361/720 |
| 5,402,313 | * 3/1995 | Casperson et al. | 361/710 |
| 5,798,908 | 8/1998 | Herzberger et al. | 361/707 |
| 5,930,601 | * 7/1999 | Cannizzaro et al. | 438/122 |
| 6,058,013 | * 5/2000 | Christopher et al. | 361/704 |

FOREIGN PATENT DOCUMENTS

0481409A1  4/1992  (EP) ............................ H05B/41/02

* cited by examiner

Primary Examiner—Leo P. Picard
Assistant Examiner—Michael Datskovsky

(57) ABSTRACT

A printed circuit board assembly comprises a printed circuit board and a heat sink that has two surface planes. One surface plane of the heat sink is raised, and provides a surface area for contact with the printed circuit board. The other surface plane is lower than the raised surface plane. The printed circuit board extends over the lower surface plane. The distance between the raised surface plane and the lower surface plane provides space for through-hole pins that extend beneath the printed circuit board, because the underside of the printed circuit board lies on the raised surface plane. The multi-plane heat sink can be formed by an extrusion process, as well as a stamping or other process that allows for more complex patterns of surfaces.

17 Claims, 1 Drawing Sheet

PRINTED CIRCUIT BOARD ASSEMBLY WITH IMPROVED THERMAL PERFORMANCE

BACKGROUND OF THE INVENTION

1. Field of the Invention

This invention relates to the field of printed circuit board assemblies, and in particular to printed circuit board assemblies that include a heat sink.

2. Description of Related Art

Heat sinks are often used to dissipate heat from electronic components. Often, a heat sink is provided for the particular component that generates substantial heat. In many cases, however, the accumulated heat of many components necessitates the heat dissipation. In such cases, it is often more efficient and cost effective to provide a heat sink that dissipates heat from a region of a circuit board, rather than individual component heat sinks. Heat sinks are commonly required in ballast circuits that provide high voltage or high current signals to operate lamps.

U.S. Pat. No. 5,798,908, issued Aug. 25, 1998 to Herzberger et al, discloses a printed circuit board assembly comprising a printed circuit board and an integral heat sink, and is incorporated by reference herein. The heat sink of the '908 patent comprises an aluminum plate that is adhered to the printed circuit board via a hot-press process. To accommodate both through-hole components as well as surface mount components, slots are cut into the aluminum plate to create voids under select areas of the printed circuit board, to accommodate the pins of the through hole components. This arrangement is well suited for use in a ballast assembly, wherein one or more transformers include pins that serve to mechanically hold the transformer in place on the printed circuit board, as well as providing the electrical contact between the printed circuit board and the coils of the transformer. After assembly, the voids are filled, or covered by another plate, to avoid inadvertent contact with the high voltages that are typically associated with a lamp ballast.

BRIEF SUMMARY OF THE INVENTION

It is an object of this invention to provide a heat sink for a printed circuit board that allows for through-hole components, but does not require cutting voids in the heat sink. It is a further object of this invention to provide a printed board assembly with integral heat sink that is particularly well suited for ballast applications.

These objects and others are achieved by providing a printed circuit board assembly that comprises a printed circuit board and a heat sink having two surface planes. One surface plane of the heat sink is raised, and provides a surface area for contact with the printed circuit board. The other surface plane is lower than the raised surface plane. The printed circuit board extends over the lower surface plane. The distance between the raised surface plane and the lower surface plane provides space for through-hole pins that extend beneath the printed circuit board, because the underside of the printed circuit board lies on the raised surface plane. The multi-plane heat sink can be formed by an extrusion process, as well as a stamping or other process that allows for more complex patterns of surfaces.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

Figure 1:
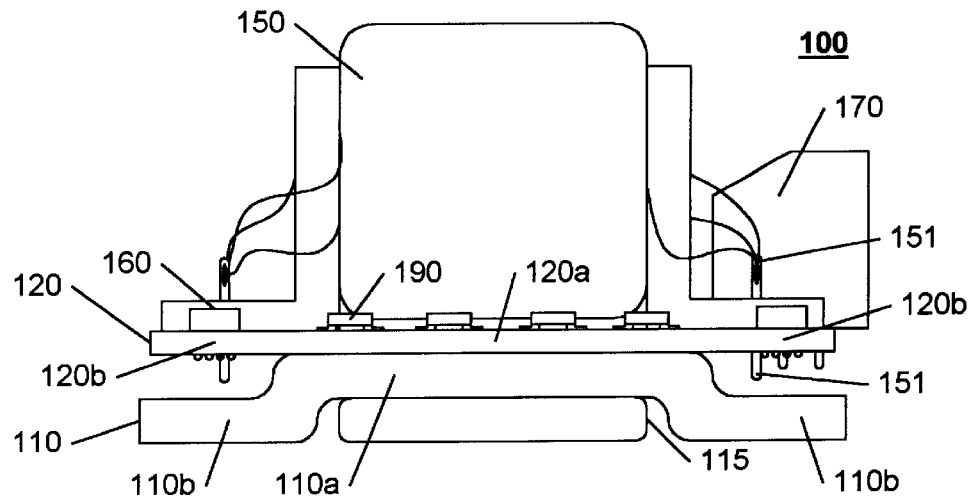
FIGS. 1 and 2 illustrate two views of an example ballast assembly that includes a printed circuit board assembly in accordance with this invention.
Figure 2:
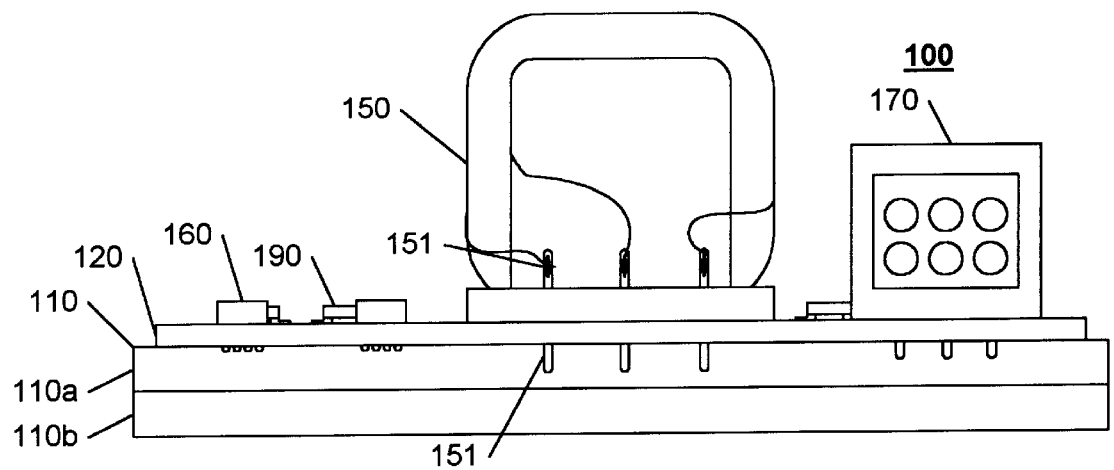

FIGS. 1 and 2 illustrate two views of an example ballast assembly 100 that includes a printed circuit board assembly that includes a printed circuit board 120, and a heat sink 110. In accordance with this invention, the heat sink 110 includes sections 110*a*, 110*b* at different planes. As illustrated, section 110*a* is at a higher horizontal plane than section 110*b*. For ease of reference, section 110*a* is hereinafter referred to as the "raised" section, and section 110*b* as the "recessed" section. As illustrated in FIG. 1, the recessed section 110*b* of the heat sink 110 includes two sections, one to each side of the raised section 110*a*. The singular form "section" is used herein for ease of reference, and not intended to limit the scope of this invention. The recessed section 110*b*, for example, includes all portions of the heat sink that are at a plane that is below the plane of all the other portions of the heat sink that form the raised section 110*a*.

The printed circuit board 120 comprises two types of regions. One region 120*b* is configured to allow for "feed-through" holes that facilitate connection from one side of the printed circuit board 120 to the other. As is known in the art, feed-through components 150, 160, 170 typically use "pins" 151 that pass through the circuit board 120, and extend beyond the circuit board 120. The extension of the pins 151 beyond the circuit board 120 facilitates soldering and other manufacturing processes. For example, the pins and holes may be used to mechanically fasten the component to the printed circuit board, in addition to, or independent of, an electrical connection. The other region 120*a* is primarily intended for components 190, such as surfacemount devices, that do not require a "feed-through" hole in the printed circuit board 120. The term "region" is used herein in the same manner as "section" discussed above. That is, the "feed-through region" 120*b* of the circuit board 120, as used herein, may include multiple discontinuous areas of the circuit board 120, each area being configured to allow for feed-through holes. The region 120*a*, hereinafter termed the "surface-mount" region, may similarly include multiple discontinuous areas that do not require feed-through holes.

In accordance with this invention, the printed circuit board assembly includes the printed circuit board 120 and heat-sink 110 being arranged so as to provide a coincidence between the surface mount region 120*a* of the circuit board 120 and the raised section 110*a* of the heat sink 110, and a correspondence between the feed-through region 120*b* and the recessed section 110*b*. Because the recessed section 110*b* is at a lower plane than the raised section 110*a*, this arrangement allows for space between the feed-through region 120*b* and the heat sink 110 in the area of the recessed section 110*b*, to allow for feed-through protrusions, such as the pins 151. Because the heat sink 110 is in contact with a region 120*a* of the printed circuit board 120, it serves to dissipate heat from the components 150, 160, 170, and 190, as required. As is common in the art, heat sinks dissipate thermal energy by a variety of techniques. The increased mass of a heat sink allows for a slower rise in temperature for the same thermal energy output from the components; an increased surface area of a heat sink allows for a faster dissipation of the thermal energy into the surrounding space; the thermal conductivity of a heat sink allows for thermal energy to be conducted to other devices that can serve as further heat sinks. In a preferred embodiment, the heat sink 100 comprises aluminum, steel, or other inexpensive material having a high thermal conductivity.

The principles of this invention are particularly well suited to ballast assemblies that are used to provide high voltage or high current driving signals to lamps. The reliability of a ballast assembly is highly dependent upon the peak operating temperature of the components in the ballast assembly. FIGS. 1 and 2 illustrate an example of a typical ballast assembly 100 that includes a transformer 150, circuit devices 160, 190, and a connector 170 for connection to a power source and to a lamp. Electronic ballasts are often subject to a variety of safety regulations, most of which are designed to prevent inadvertent contact with high voltage or high current terminals within the ballast. It is significant to note that the heat sink 110 in accordance with this invention facilitates compliance with such safety regulations by preventing access to the circuit board 120 from beneath the heat sink 110. An enclosure (not shown) can be configured to envelop the ballast assembly on each of the sides and the top, and can use the heat sink as the remaining enveloping member, thereby saving the cost of an enclosure base. Alternatively, a conventional six-sided (top, bottom, 4 sides) enclosure can be used, wherein the bottom of the enclosure is in contact with the heat sink 110. In this embodiment, assuming that the enclosure is a thermal conductive material, such as a sheet metal enclosure, the heat sink 110 conducts heat to the enclosure to further reduce the operational temperature of the ballast 100. Illustrated in FIG. 1 is an optional thermal coupling device 115 that can be used to further facilitate a conduction of thermal energy from the heat sink 110 to a sheet of thermal conductive material placed beneath the heat sink 110, such as the bottom plate of an enclosure that envelops the ballast 110, or to the light fixture that contains this ballast 100. Note also that the relative mass and structural integrity of the heat sink 110 provides an integral base and mounting surface for attaching the ballast 100 to the light fixture.

The shape and orientation of the heat sink 110 will be dependent upon the intended arrangement of the components 150–190, and the intended integration with the light fixture. The uniform-thickness shape illustrated in the figures is easily manufactured using a stamping process. A stamping process can also be used to provide a relatively low cost means of providing a more complex arrangement of recessed and raised sections, as required. The shape illustrated in the figures also allows for an extrusion of the heat sink, which can be expected to be less expensive than other techniques in high volume applications. As would be evident to one or ordinary skill in the art, if an extrusion process is used, the thickness of the heat sink 110 in the raised area 110*a* can be increased so as to provide a substantially flat lower surface area below the areas 110*a* and 110*b*, thereby filling the area of, and eliminating the need for, the optional thermal coupling device 115. These and other metal forming techniques are common to one of ordinary skill in the art. Also evident to one of ordinary skill in the art, a variety of techniques are available to incorporate the principles of this invention within a variety of constraints. For example, if the printed circuit board contains conductors on the lower surface, an insulating layer of tape can be affixed to either the printed circuit board or the heat sink to prevent an electrical short. In another example, a thermal conductive paste can be applied to the heat sink 110 to increase the thermal transfer efficiency between the printed circuit board 120 and the heat sink 110, or between the heat sink 110 and an enclosure.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

I claim:

1. A printed circuit board assembly comprising:
   a heat sink having a first section and a second section,
      the first section having a first surface that is on a first plane that is separated by a distance from a second surface on a second plane corresponding to the second section,
   a printed circuit board that is configured to be arranged with the heat sink so that
      a first region of the printed circuit board is coincident with the first section, and
      a second region of the printed circuit board extends beyond the first section and over the second section,
   the distance between the first and second plane providing a space below the printed circuit board in the second region, thereby facilitating a mounting of through-hole components at the second region of the printed circuit board.

2. The printed circuit board assembly of claim 1, wherein the first region of the printed circuit board is configured to facilitate a mounting of surface-mount components.

3. The printed circuit board assembly of claim 1, wherein the heat sink comprises at least one of: aluminum and steel.

4. The printed circuit board assembly of claim 3, wherein the heat sink is formed to provide the first and second sections via at least one of: an extrusion process and a stamping process.

5. The printed circuit board assembly of claim 1, further including
   a thermal coupling device that is configured to be mounted coincident with the first section of the heat sink, on an opposite surface of the first section than the printed circuit board.

6. The printed circuit board assembly of claim 1, wherein the heat sink is formed to provide a base for the printed circuit board assembly that facilitates a mounting of the printed circuit board assembly.

7. The printed circuit board assembly of claim 6, wherein the printed circuit board assembly comprises a ballast.

8. The printed circuit board assembly of claim 6, wherein the heat sink is further formed such that the base that is provided is substantially flat beneath an entirety of the printed circuit board assembly.

9. The printed circuit board assembly of claim 8, further including
   a thermal coupling device that is configured to fill in areas of the heat sink so as to provide the substantially flat base.

10. A ballast comprising:
    a printed circuit board having at least a first region and a second region,
    a transformer that is mounted on the printed circuit board via pins that extend through the printed circuit board in the second region, and
    a heat sink that includes:
       a first section that includes a first surface that is coincident with the first region of the printed circuit board, and a second section that includes a second surface that is on a different plane from the first section, wherein:

the pins are configured to extend through the printed circuit board within the second region of the circuit board, the second section is configured to be aligned with a second region of the printed circuit board, thereby providing a space between the second region of the printed circuit board and the second section of the heat sink that accommodates the pins.

11. The ballast of claim 10, further including:

surface-mount components, and through-hole components that are configured to be mounted in the second region of the printed circuit board that is aligned with the second section of the heat sink.

12. The ballast of claim 10, wherein the second section is a recessed section of a plurality of recessed sections that are on the different plane from the first section, each recessed section being configured to provide space between corresponding regions of the printed circuit board and the heat sink.

13. The ballast of claim 12, further including:

surface-mount components, and through-hole components that are configured to be mounted in regions of the printed circuit board corresponding to the plurality of recessed sections.

14. The ballast of claim 10, further including a thermal coupling device that is configured to be coincident with the first section of the heat sink and adjacent the enclosure, that facilitates a heat transfer from the first section of the printed circuit board to the enclosure.

15. A method of manufacturing a printed circuit board assembly comprising:

providing a printed circuit board having a first region and at least one second region, the at least one second region containing through-holes that facilitate mounting of through-hole components, providing a heat sink having a first section that includes a first surface at a first plane and at least one second section that includes a second surface at a second plane that differs from the first plane, arranging the heat sink relative to the printed circuit board such that the first section of the heat sink is immediately adjacent the first region of the printed circuit board, and the at least one second section of the heat sink is aligned with the at least one second region of the printed circuit board, thereby providing a space between the at least one second region of the printed circuit board and the heat sink.

16. The method of claim 15, further including:

mounting the through-hole components on the printed circuit board.

17. The method of claim 16, wherein the through-hole components include a transformer.

* * * * *